United States Patent
Hamdioui et al.

(10) Patent No.: US 9,824,753 B2
(45) Date of Patent: Nov. 21, 2017

(54) COMPUTING DEVICE FOR "BIG DATA" APPLICATIONS USING MEMRISTORS

(71) Applicant: Technische Universiteit Delft, Delft (NL)

(72) Inventors: Said Hamdioui, Delft (NL); Koenraad Laurent Maria Bertels, Delft (NL); Mottaqiallah Taouil, Delft (NL)

(73) Assignee: TECHNISCHE UNIVERSITEIT DELFT, Delft (NL)

( * ) Notice: Subject to any disclaimer, the term of this patent is extended or adjusted under 35 U.S.C. 154(b) by 0 days.

(21) Appl. No.: 14/918,995

(22) Filed: Oct. 21, 2015

(65) Prior Publication Data
US 2017/0117041 A1    Apr. 27, 2017

(51) Int. Cl.
*G11C 11/00* (2006.01)
*G11C 13/00* (2006.01)

(52) U.S. Cl.
CPC ........ *G11C 13/0069* (2013.01); *G11C 13/003* (2013.01); *G11C 13/004* (2013.01); *G11C 13/0007* (2013.01); *G11C 2213/15* (2013.01); *G11C 2213/72* (2013.01); *G11C 2213/73* (2013.01); *G11C 2213/77* (2013.01)

(58) Field of Classification Search
None
See application file for complete search history.

(56) References Cited

U.S. PATENT DOCUMENTS

| | | | | |
|---|---|---|---|---|
| 8,395,926 B2* | 3/2013 | Kreupl | ............ | G11C 11/16 365/148 |
| 2015/0055209 A1* | 2/2015 | Corkery | ............ | G02B 6/3512 359/320 |
| 2016/0012876 A1* | 1/2016 | Di Ventra | ............ | G11C 7/1006 365/149 |
| 2016/0019453 A1* | 1/2016 | Klefenz | ............ | G06N 3/063 706/26 |
| 2016/0042787 A1* | 2/2016 | Brooks | ............ | G11C 13/004 365/148 |

OTHER PUBLICATIONS

Memristor-Based Circuits and Architectures by Shahar Kvatinsky Submitted to the Senate of the Technion—Israel Institute of Technology Sivan, 5774 Haifa May 2014.*

* cited by examiner

*Primary Examiner* — Harry W Byrne
*Assistant Examiner* — Sultana Begum
(74) *Attorney, Agent, or Firm* — Young & Thompson

(57) ABSTRACT

A computing device includes a computation circuit and a data storage circuit. The computation circuit is coupled to the data storage circuit and is arranged for reading and writing data from/to the data storage circuit. The computing device includes a memory array of non-volatile memory elements and controlling circuitry connected to the memory array for reading and writing data from/to selected memory elements in the array. The computation circuit and the data storage circuit are located in the memory array, and the non-volatile memory elements of the memory array are memristor-type elements.

18 Claims, 3 Drawing Sheets

COMPUTING DEVICE FOR "BIG DATA" APPLICATIONS USING MEMRISTORS

FIELD OF THE INVENTION

The present invention relates to a computing device comprising a computation circuit and a data storage circuit. Also, the invention relates to a method for such a computing device. Additionally, the invention relates to an electronic device comprising such a computing device.

BACKGROUND OF THE INVENTION

Today's computation applications are becoming extremely data intensive; examples can be found in fields such as healthcare, social media, large scientific/engineering experiments, and security. As the speed of information growth exceeds Moore's Law, since the beginning of this century, excessive data is posing major challenges and a new scientific paradigm is born: data-intensive scientific discovery, also known as Big Data problems.

A large number of fields and sectors, ranging from economics and business activities to public administration, from national security to many scientific research areas, involve data-intensive applications, hence, dealing with Big Data problems. Big Data is extremely valuable to generate productivity in businesses and evolutionary breakthroughs in scientific disciplines.

The primary goal of Big Data applications is to analyze and increase the understanding of both data and processes in order to extract the highly useful information hidden in a huge volume of data, and therefore, it comes with many challenges, such as data capture, data storage, data analysis, and data visualization.

Performing data analysis within economically affordable time and energy is the pillar to solve big data problems.

Big Data analysis can be used to increase e.g., the productivity. Storing and analyzing such data is posing major challenges as the data volume already surpasses the capability of today's computers that suffer from e.g., communication and memory-access bottlenecks due to limited bandwidth. For instance, a (network) transfer of one petabyte of data at a rate of 1000 MB/second will take about 12.5 days.

Prior art computing systems, developed since the introduction of stored program computers by John von Neumann in the forties of the previous century, can be classified based on the location of the so-called "working set" (loosely defined as the collection of information referenced by a program during its execution) into typically four classes. In the early computers (typically before the 1980s), the working set was contained in main memory. Due to the gap between the core (CPU) speed and the memory, caches were introduced to reduce the gap and increase the overall performance, where the caches have become the location of the working set.

Still, at present, computing systems for data-intensive applications are still based on Von Neumann (VN) architectures and still rely on many parallel (mini-)cores with a shared SRAM cache (parallel CPUs, GPUs, SIMD-VLIWs, vector processors). Clusters of cores can be replicated many times, each having their own L1 cache, but it is far from realistic to assume a distributed reasonable sized L1 cache in every mini-core; too much area and leakage power overhead is incurred in that case. Such solutions suffer from major limitations such as a decreased performance acceleration per core, increased power consumption, and limited system scalability. These issues are mainly caused by the processor-memory bottleneck of the VN architecture.

Memory size and memory access do not only kill the performance, but also severely impact energy/power consumption in Big Data applications.

As current data-intensive applications require huge data transfers back and forth between processors and memories through load/store instructions, the maximal performance cannot be extracted, as the processors will have many idle moments while waiting for data. Computation, which is the main activity of a system, by far consumes less energy and chip area, and has lower execution time compared to communication and memory access (e.g., an L1 cache), especially for data intensive applications. The energy consumption of the cache accesses and communication makes up easily 70% to 90%. For example, executing a multiply instruction on a simple in-order core in 45 nm technology consumes about 70 pJ (pico Joule), whereas the actual operation itself consumes less than 4 pJ. The overhead is due to instruction fetching and decoding and other control.

In addition, CMOS technology, which is used to implement today's computation architectures, contributes to such consumption due to high leakage currents, as the technology is reaching the inherent physical limits due to downscaling.

Furthermore, CMOS technology is facing other challenges such as high static power consumption, reduced performance gain, reduced reliability, complex manufacturing process leading to low yield and complex testing process, and extremely costly lithography masks.

In conclusion, today's CMOS based architectures are not able to provide the computation capability needed for data-intensive applications. New architectures based on new technologies are urgently required.

It is an object of the present invention to overcome or mitigate one or more disadvantages from the prior art.

SUMMARY OF THE INVENTION

The object of the invention is achieved by a computing device comprising a computation circuit and a data storage circuit, with the computation circuit being coupled to the data storage circuit and arranged for reading and writing data from/to the data storage circuit, wherein the computing device comprises a memory array of non-volatile memory elements and controlling circuitry connected to the memory array for reading and writing data from/to selected memory elements in the array; the computation circuit and the data storage circuit are located in the memory array, and the non-volatile memory elements of the memory array are memristor-type elements.

Advantageously, the computing device provides a solution to the performance bottleneck as suffered by the VN based computation architectures, by arranging the computation circuit and the data storage circuit in the same location, i.e., the memory array. In the computing device of the invention, which provides the option of computation-in-memory, both the computation and the storage can take place at the same physical location.

Thus, the computing device relates to a new architecture that interweaves storage and computation.

Moreover, by using memristor-type elements as basis for the memory array, both storage and information processing units can be built, as the memristor type element is a two-terminal resistive-switching device.

In addition, the fabrication of a memristor based memory array is CMOS process compatible, and has lower cost. A memristor based memory array has zero standby power, nanosecond switching speed, great scalability and high density, and non-volatile nature. A memristor type element offers a high OFF/ON resistance ratio and is promising to have a good endurance and retention time.

Finally, because the memristor technology is highly scalable (with a memristor feature size of about 5 nm), huge memory array architectures allowing massive parallelism of computation-in-memory become feasible. As the storage and computation are integrated together, the communication bottleneck is significantly reduced in the computing device of this invention.

According to an aspect of the invention, the memristor type elements are programmable with at least two different resistive states.

This allows that each memristor type element can act as a binary storage element, allowing storage of a binary data element, a bit.

According to an aspect of the invention, the memory array is a crossbar array, the crossbar array comprising a plurality of parallel first bars extending in a first direction and a second plurality of parallel second bars extending in a second direction not parallel to the first direction, such that each first bar crosses the second plurality of second bars and at each crossing forms a contact, each contact forming one memristor type element.

According to an aspect of the invention, the controlling circuitry is interfaced with CMOS based circuitry.

According to an aspect of the invention, the controlling circuitry is configured for a plurality of parallel read/write operations in the memory array.

According to an aspect of the invention, the memristor-type element is based on one selected from phase change memory technology, electrostatic/electronic effect memory technology, redox memory technology, Spin Transfer Torque Magneto-resistive device, Ferro-electronic tunneling function device, or any resistive switching device.

According to an aspect of the invention, the memristor-type element is based on redox memory technology using either a valence change memory memristor device type or an electrochemical metallization memristor device type.

According to an aspect of the invention, in the memory array the memristor type elements are each equipped with a selector device, the selector device being either a diode device or a transistor device.

According to an aspect of the invention, in the memory array the memristor type elements each comprise a modified memristor of complementary resistive switcher type.

According to an aspect of the invention, the controlling circuitry is configured during an access of a memristor type element on a wordline and bitline associated with said memristor type element in the memory array to apply bias voltage on not-associated wordlines and bitlines of the memory array that are not accessed.

Additionally, the present invention relates to a method for a computing device comprising a computation circuit and a data storage circuit, with the computation circuit being coupled to the data storage circuit and is arranged for reading and writing data from/to the data storage circuit, wherein the computing device comprises a memory array of non-volatile memory elements and controlling circuitry connected to the memory array for programming and configuring the memory elements to perform computation in the array; the computation circuit and the data storage circuit are located in the memory array, and the non-volatile memory elements are memristor-type elements; the method comprising:

storing of data in the data storage circuit in the memory array; performing computations with data in the data storage circuit using the computation circuit.

According to an aspect of the invention, the method provides that said storage of data and said performance of computations are controlled by the controlling circuitry.

According to an aspect of the invention, the method provides that the controlling circuitry is driven by instructions from CMOS based circuitry.

According to an aspect of the invention, the method provides that computations are performed on any "big data" application comprising a genomics-related computing application, an application for parallel computation of a plurality of add-operations.

Also, the invention relates to an electronic device comprising a computing device as described above, wherein the computing device provides either random-access-storage or neural-network processing capability to the electronic device.

Advantageous embodiments are further defined by the dependent claims.

BRIEF DESCRIPTION OF DRAWINGS

The invention will be explained in more detail below with reference to drawings in which illustrative embodiments thereof are shown. The drawings are intended exclusively for illustrative purposes and not as a restriction of the inventive concept. The scope of the invention is only limited by the definitions presented in the appended claims.

DETAILED DESCRIPTION OF THE DRAWINGS

Figure 1A:
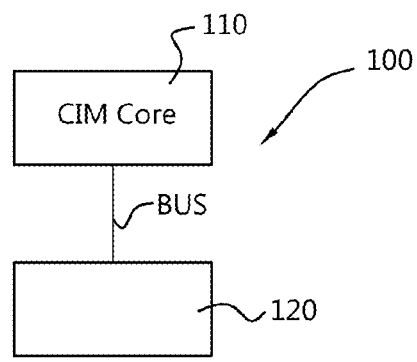
FIGS. 1a and 1b show schematic layouts of a computing device according to an embodiment of the invention.
Figure 1B:
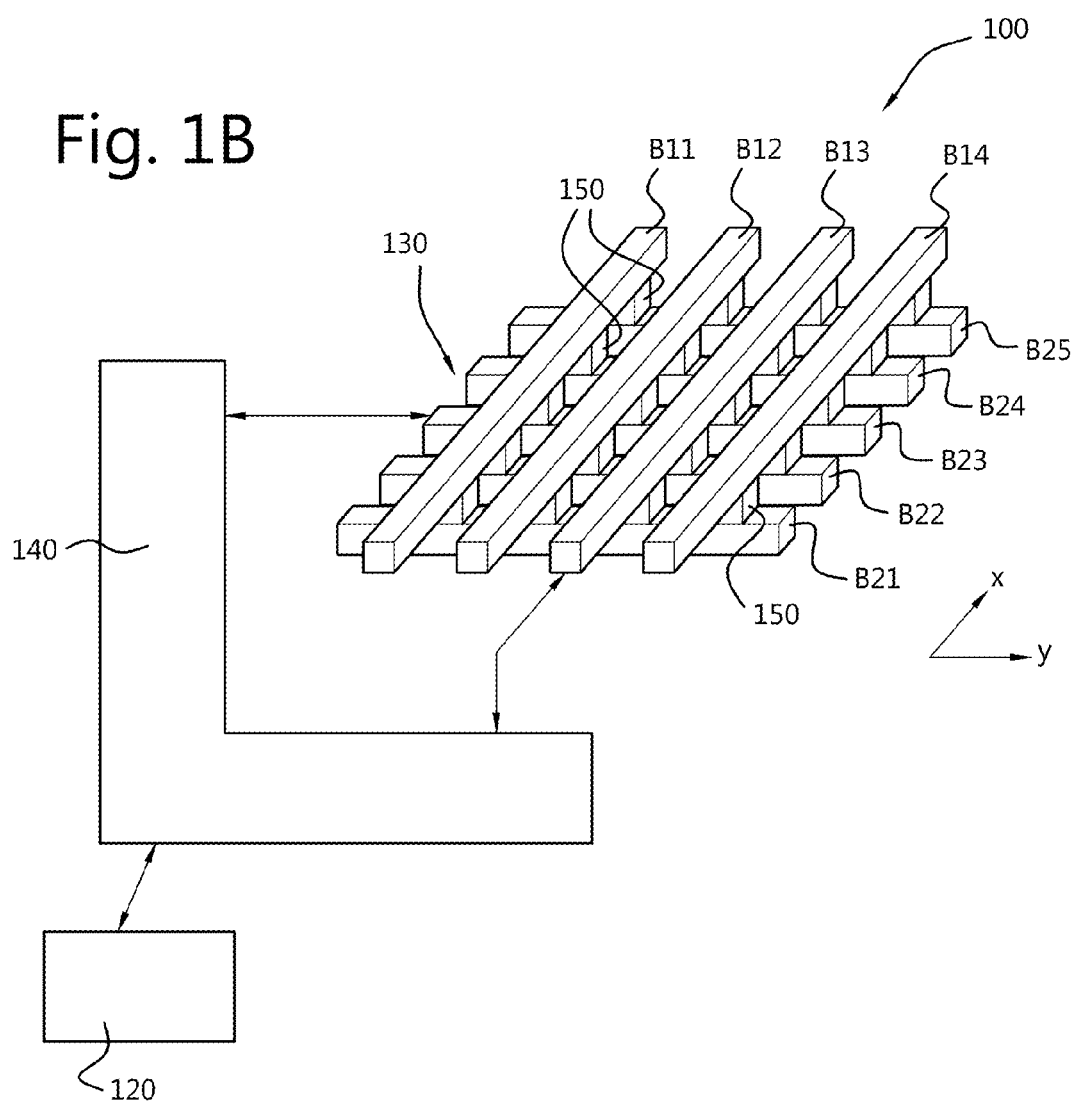

FIG. 1a and FIG. 1b show schematic layouts of a computing device 100 according to an embodiment of the invention.

FIG. 1a shows schematically layout of the computing device 100 in concept of the invention. According to the invention, the computing device 100 comprises a processing circuitry and a data storage circuitry, and in which the processing circuitry and the data storage circuitry are integrated in a single core device 110 to create a "computation-in-memory" (CIM) computing device. The computing device is electronically connected, schematically indicated by line BUS with an external memory 120. The external memory 120 can be part of a traditional VN computing architecture or be a digital storage unit.

The computing device 100 is a non-volatile programmable array device consisting of memristor type elements as array elements and a controlling circuitry.

Through the electronic connection BUS, data (relating to the Big Data application) to be processed, is moved from the external memory 120 to the array 110 of the computing device, so as to have the data working set completely in the computing device. In addition, the instructions for processing are also programmed and located as processing circuitry in the computing device.

FIG. 1b shows a layout of the computing device 100 in accordance with an embodiment. The computing device 100 comprises said non-volatile programmable array device 130 consisting of memristor type elements 150 and controlling circuitry 140. The array 130 of the computing device 100 is embodied as a "crossbar" array, which crossbar comprises a plurality of parallel first bars B11, B12, B13, B14 extending in a first direction X and a second plurality of parallel second bars B21, B22, B23, B24, B25 extending in a second direction Y not parallel to the first direction X. In the array 130 each first bar B11; B12; B13; B14 crosses the second plurality of second bars B21; B22; B23; B24; B25. At each crossing of one first bar and one second bar a junction 150 forms a contact that consists of a memristor type element. Thus, the first bars function as top electrodes of the memristors in the memory array, and the second bars function as bottom electrodes.

In accordance with the invention, the memristor type element is configurable in at least two different resistive states, for example with "high" and "low" resistive values.

The controlling circuitry 140 is electrically connected to the plurality of first bars B11, B12, B13, B14 and to the plurality of second bars B21, B22, B23, B24, B25. The controlling circuitry 140 configures the memristor elements 150 in the array 130, by using suitable voltage and current values to interact with each memristor element between the first bars and the second bars.

In addition, the controlling circuitry 140 is electronically interfaced with the external memory 120.

This setup allows to enter data and instructions of the application to be processed into memristors of the crossbar memristor array by programming each memristor in one of its at least two resistive states. The controlling circuitry 140 writes a resistive value in each of the memristors that are accessed by the controlling circuitry. In this respect, a memristor 150 can be used as a data-bit. Also, memristors 150 in the memory array 130 are programmed as element of a resistive network of a portion of the memory array to execute instructions needed for computation (such as addition, multiplication, logic, etc.)

The data-bits and instructions in the circuitry of the memory array are arranged in a manner that parallel processing of data by the instructions in the processing circuitry can occur.

The controlling circuitry has been shown as two units 140 that are coupled to either the first bars B11, B12, B13, B14 or the second bars B21, B22, B23, B24, B25. It will be appreciated that the controlling circuitry may be a single unit interfaced with both first and second bars.

FIGS. 2*a*-2*d* shows the concept of a crossbar array as an embodiment of the memory array and types of memristor devices.

Figure 2A:
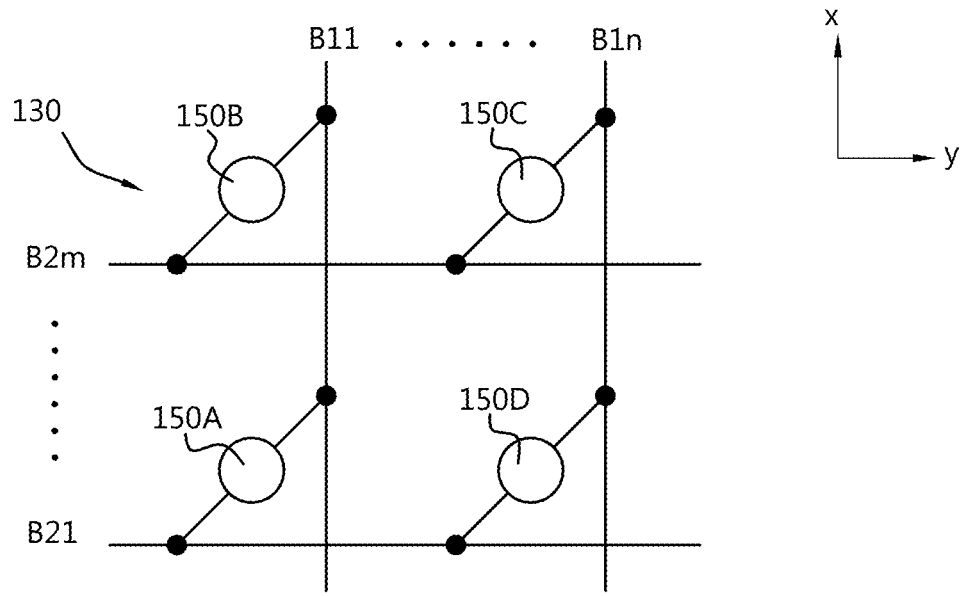
FIGS. 2a-2d shows the concept of a crossbar array as an embodiment of the memory array and types of memristor devices.

FIG. 2*a* shows a detail of a crossbar memory array. The crossbar memory array comprises first bars B11 . . . B1*n* extending in a first direction X and second bars B21 . . . B2*m* extending in a second direction Y, perpendicular to the first direction X.

The first bars B11 . . . B1*n* cross each of the second bars B21 . . . B2*m* in a manner that at each crossing a memristor type element 150A, 150B, 150C, 150D is arranged. In total, the memory array 130 comprises n×m memristor type elements.

The memristor type element may be based on various technologies and can be classified based on their dominant physical operating mechanism into three classes: Phase Change Memories, Electrostatic/Electronic Effects Memories, and Redox (reduction/oxidation) memories. The redox-based resistive switching devices (ReRAMs) are attracting most attention due to their excellent scaling, endurance, and retention properties; their physical mechanism for switching is based on reduction/oxidation (Redox)-related chemical effects.

The category of "Redox RAM" encompasses a wide variety of Metal-Insulator-Metal (MIM) structures; the electrochemical mechanisms driving the resistance state (from high to low or vice versa) can operate in the bulk I-layer (insulator layer), along conducting filaments in the I-layer, and/or at the I-layer/metal contact interfaces in the MIM structure. The ReRAMs consist of three types, two bipolar and one unipolar.

The two bipolar devices are based on Valence Change Memory (VCM) and the Electrochemical metallization (ECM) device technology. In ECM devices a conductive metallic filament (Cu or Ag) is established during switching, thus, the filament length can be considered the state variable.

Figure 2B:
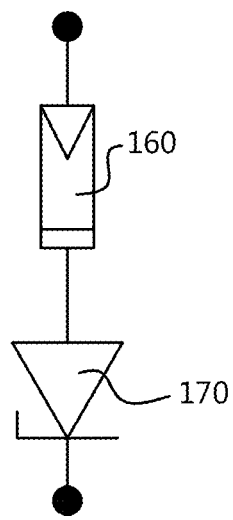

The primary driver for use of ReRAM device is the semiconductor industry seeking for novel energy-efficient non-volatile and highly scalable memory elements. A straightforward implementation of the ReRAM array can be realised using a passive crossbar architecture, resulting in the highest density of the memory array. However, this architecture suffers from undesired paths for current called sneak paths. Due to existence of low resistive current paths, the maximum array would be limited to small arrays. To overcome this issue, various solutions are proposed:

1. The implementation of selector devices, which are separate devices 170 in connection with the ReRAM cell 160 that can comprise a diode or a transistor (1S1R) as schematically depicted in FIG. 2*b*.

Figure 2C:
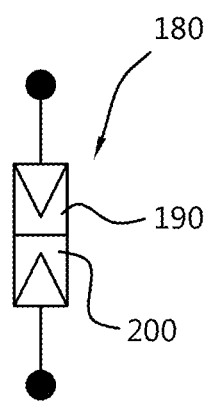
Figure 2D:
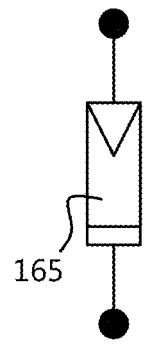

2. The implementation of switching devices which involves that the resistive memristor device 180 is modified. E.g., serially connecting of two anti-serial memristive devices 190, 200 (bipolar switches) results into a "complementary resistive switcher" (CRS) being able to block the current at low voltage irrespective of the state of the memristor device 180, as schematically depicted in FIG. 2*c*, or the deployment of a high nonlinear memristive device 165 (due to current-controlled negative differential resistance) to overcome the current sneak path (FIG. 2*d*).

3. The implementation of a bias scheme, where the controlling circuitry 140 applies a voltage bias to non-accessed wordlines and bitlines of the crossbar memory array 130. The voltage on the non-accessed wordlines and bitlines are set to values different from those applied on the wordline and bitlines accessed by the controlling circuitry 140 in order to minimize the sneak path current.

Examples are multistage reading and use of an AC signal instead of a DC signal for sensing the data stored in the accessed cell.

Figure 3:
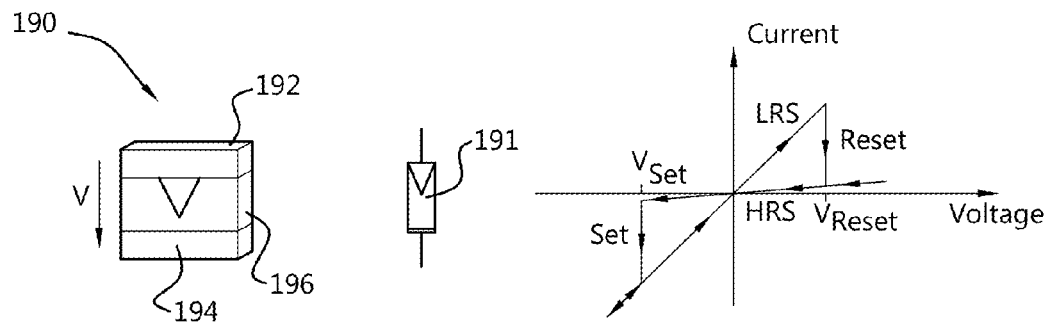
FIG. 3 illustrates the respective I-V characteristics of individual memristor cells A and B, and a CRS cell which consists of two memristive ECM devices A and B.
Figure 3:
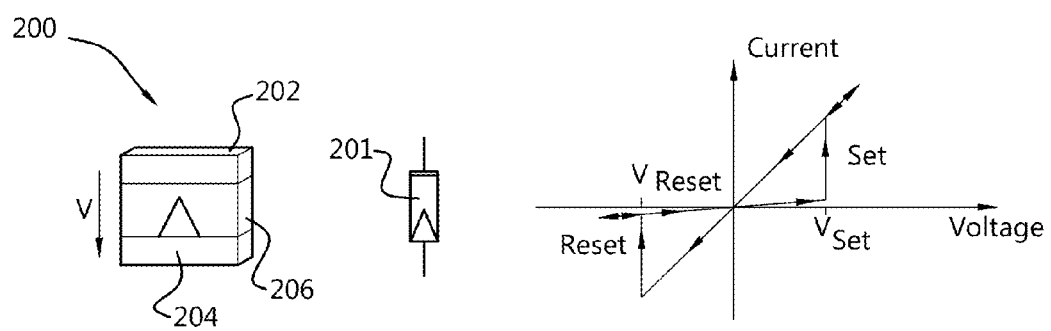
Figure 3:
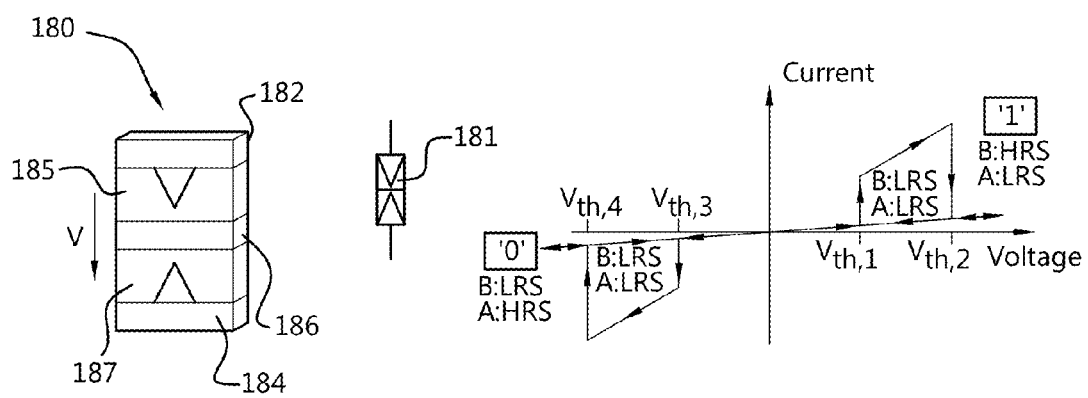

FIG. 3 illustrates the respective I-V characteristics of individual memristor cells 190 and 200, and a CRS cell 180 which consists of two memristive ECM devices 190 and 200.

The CRS cell is constructed from two anti-serial connected memristor devices 190 and 200. In the top of FIG. 3 an individual ECM device 190 (top, left) and its associated symbol 191 is shown next to its I-V characteristic (top, right). In the direction of the voltage V, the ECM device 190 has a first conductive terminal 192 which may comprise Pt, an intermediate layer 196 and a second conductive terminal 194 which may comprise Cu.

In the centre of FIG. 3, an individual ECM device 200 (centre, left) and its associated symbol 201 is shown next to its I-V characteristic (centre, right). The ECM device 200 has a first conductive terminal 202 which may comprise Cu, an intermediate layer 206 and a second conductive terminal 204 which may comprise Pt. Note that the arrangement of ECM device 200 is opposite to that of ECM device 190 with respect to the voltage direction V.

At the bottom of FIG. 3, a CRS memristor cell 180 (bottom, left) is shown, which is substantially identical to a serial connection of ECM 190 and ECM device 200 as described above, with two outer conductive terminals 182, 184 separated by a stack of a first intermediate layer 185, a conductive centre layer 186 and a second intermediate layer 187. Next to the CRS memristor cell 180, its associated symbol 181 and the I-V characteristic of the CRS memristor cell 180 are shown (bottom, right). The I-V characteristics of the CRS memristor cell 180 correspond substantially with the sum of the I-V characteristics of the ECM device 190 and of the ECM device 200.

In the I-V characteristics, the states '0' and '1' are the logical storage states and the state 'LRS/LRS' occurs only when reading the memory state. The internal memory states '0' and '1' of the CRS memristor cell 180 are indistinguishable at low voltages because state '0' as well as state '1' show a high resistance. Therefore, no parasitic current sneak paths can arise. To read the stored information of a single CRS memristor cell 180, a read voltage must be applied to the CRS memristor cell 180. If the CRS memristor cell 180 is in state '0', then it switches to state 'ON'; if the CRS memristor cell 180 is in state '1' then it remains in its state. In case of a conventional crossbar (with resistive current paths), reading ON state is a destructive operation, therefore, it is necessary to write back the previous state of the cell after reading it. In general, the writing of state '0' requires a negative voltage (V<Vth,4) and for writing state '1' a positive voltage V>Vth,2 is required.

The computing device 100; 110 of the present invention can be used in various "big data" or data-intensive applications such as healthcare, social media, large scientific/engineering experiments, and security. As an example, in healthcare applications, genomics are used in diagnosing or treating diseases. In such an application sampled genetic data (DNA) is compared with reference data of "healthy" DNA. Both the sample DNA as the reference DNA is represented by large amounts of data in the order of GB's and more (>>$10^9$ bytes). According to the invention, both the complete sample data and the complete reference data are entered into the memory array 130 in combination with the instructions implemented as logic circuit to compare the sample and reference data by sorted index. The controlling circuitry 140 is arranged to control the comparisons.

As a further example, in mathematics arithmetic operations on a large amount of data may be performed in parallel by entering into the memory array 130 the complete working set of data to be processed in combination with the instructions implemented as logic circuit to carry out said arithmetic operations. The controlling circuitry 140 is arranged to control the operations.

Although computing-in-memory architecture targets data-intensive applications, especially applications that require massive parallelism and huge data working sets to be continuously kept in the memory, the computing device 100; 110 according to the invention can be adapted to any computation-in-memory (CIM) architecture for high computation efficiency.

Examples of applications of the computing device use are replacement of RAM, flash and even disk drives, complex self-learning neural networks, advanced artificial neural brains. The computing device may be implemented in advancing Exascale computing, 'computer on a chip' capable devices, as well as in neural and analogue computing.

The invention has been described with reference to the preferred embodiment. Obvious modifications and alterations will occur to others upon reading and understanding the preceding detailed description. It is intended that the invention be construed as including all such modifications and alterations insofar as they come within the scope of the appended claims.

The invention claimed is:

1. A computing device, comprising:
   a memory array of programmable memristors configured to operate as non-volatile memory elements; and
   controlling circuitry connected to the memory array that selectably provides signals to the programmable memristors of the memory array i) to write resistive values as data-bits into individual programmable memristors of the memory array, and also ii) to program a portion of said individual programmable memristors to execute instructions for computation,
   the controlling circuitry configured to arrange the data-bits and instructions in the memory array in a manner such that the memory array operates as a computation circuit coupled to and interweaved with a data storage circuit, and to carry out parallel processing on data represented by the data-bits stored in the memory array in accordance with the instructions stored in the memory array.

2. The computing device according to claim 1, wherein the programmable memristors of the memory array are programmable with at least two different resistive states.

3. The computing device according to claim 1, wherein the memory array is arranged as a crossbar array,
   the crossbar array comprising a plurality of parallel first bars extending in a first direction and a second plurality of parallel second bars extending in a second direction not parallel to the first direction, such that each first bar crosses the second plurality of second bars and at each crossing forms a contact, each contact forming one programmable memristor-type element of the memory array.

4. The computing device according to claim 1, wherein the controlling circuitry is interfaced with CMOS based circuitry.

5. The computing device according to claim 1, wherein the controlling circuitry is configured to operationally carry out a plurality of parallel read/write operations in the memory array including both storage of the data in the memory array and performance of computations upon the data stored in the memory array, and also for control of computational operations that take place upon the memory array.

6. The computing device according to claim 1, wherein the controlling circuitry is connectable to an external memory.

7. The computing device according to claim 1, wherein memristor-type elements forming each of the programmable memristors are based on one selected from phase change memory technology, electrostatic/electronic effect memory technology and redox memory technology.

8. The computing device according to claim 1, wherein memristor-type elements forming each of the programmable memristors are based on redox memory technology using either a valence change memory memristor device type or an electrochemical metallization memristor device type.

9. The computing device according to claim 1, wherein, in the memory array, the programmable memristors are each equipped with a selector device, the selector device being either a diode device or a transistor device.

10. The computing device according to claim 1, wherein, in the memory array, the programmable memristors each comprise a modified memristor of complementary resistive switcher type.

11. The computing device according to claim 1, wherein the controlling circuitry is configured during an access of a programmable memristor on a wordline and a bitline associated with said programmable memristor in the memory array to apply bias voltage on not-associated wordlines and bitlines of the memory array that are not accessed.

12. A method comprising:
   providing a memory array of programmable memristors configured to operate as non-volatile memory elements, in operable connection with controlling circuitry that selectably provides signals to the programmable memristors of the memory array i) to write resistive values as data-bits into individual programmable memristors of the memory array, and also ii) to program a portion of said individual programmable memristors to execute instructions for computation;
   programming, via the controlling circuitry, a first portion of the programmable memristors of the memory array to form data-bits, representing data, into individual programmable memristors of the memory array so that the first portion of the memory array is operable as a data storage circuit;
   programming, via the controlling circuitry, a second portion of the programmable memristors of the memory array to form elements of logic circuitry so that the second portion of the memory array is operable as a computation circuit,
   the programmed memory array being operable such that the operable data storage circuit and the operable computation circuit are integrated and interweaved within the memory array; and
   performing, by way of the controlling circuitry programmed computations upon the data represented by said data-bits stored in the programmable memristors in accordance with the the logic circuitry programmed into the operable computation circuit of the programmable memristors.

13. The method according to claim 12, wherein said storage of data and said performance of computations are controlled by the controlling circuitry.

14. The method according to claim 13, wherein the controlling circuitry is driven by instructions from CMOS based circuitry.

15. The method according to claim 12, wherein computations are performed on a "big-data" application comprising genomics-related computing.

16. An electronic device comprising a computing device according to claim 1, wherein the computing device is configurable to operate in accordance with any of random-access-storage and neural-network processing capability.

17. The electronic device according to claim 16, wherein the memory array of the computing device is connectable to a further memory of the electronic device.

18. The electronic device according to claim 16, wherein the electronic device is a computing system based on non Von-Neumann architecture.

* * * * *